United States Patent
Deng et al.

(10) Patent No.: US 11,736,066 B2
(45) Date of Patent: Aug. 22, 2023

(54) OSCILLATION CIRCUIT AND METHOD OF AUTOMATIC DUTY CYCLE CALIBRATION

(71) Applicant: Realtek Semiconductor Corporation, Hsinchu (TW)

(72) Inventors: Ping-Yuan Deng, Hsinchu (TW); Chia-Liang Lin, Fremont, CA (US); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/558,718

(22) Filed: Dec. 22, 2021

(65) Prior Publication Data

US 2023/0198466 A1 Jun. 22, 2023

(51) Int. Cl.
*H03B 5/36* (2006.01)

(52) U.S. Cl.
CPC ............ *H03B 5/364* (2013.01); *H03B 5/366* (2013.01); *H03B 2200/0064* (2013.01)

(58) Field of Classification Search
CPC ... H03B 5/30; H03B 5/32; H03B 5/36; H03B 5/362; H03B 5/364; H03B 5/366; H03B 5/368; H03B 2200/0012; H03B 2200/0064
USPC ................................................. 331/154, 158
See application file for complete search history.

(56) References Cited

U.S. PATENT DOCUMENTS

| | | | | |
|---|---|---|---|---|
| 4,704,587 A * | 11/1987 | Ouyang | ................. | H03K 3/014 331/158 |
| 5,557,243 A * | 9/1996 | Ho | ........................ | H03B 5/364 331/173 |
| 6,133,801 A * | 10/2000 | Tanaka | ...................... | H03L 3/00 331/116 R |
| 10,367,462 B2 * | 7/2019 | Marques | ................ | H03B 5/366 |
| 10,707,841 B1 * | 7/2020 | Winiecki | .............. | H03F 1/0277 |
| 2010/0188159 A1 * | 7/2010 | Arai | ........................ | H03B 5/364 331/117 FE |
| 2011/0291767 A1 * | 12/2011 | Ishikawa | .............. | H03K 3/0307 331/154 |
| 2015/0222232 A1 * | 8/2015 | Takahashi | .............. | H03B 5/364 331/116 R |
| 2019/0109563 A1 | 4/2019 | Lin | | |
| 2020/0076365 A1 * | 3/2020 | Ninomiya | ................ | H03B 5/06 |

FOREIGN PATENT DOCUMENTS

| JP | H0353706 A | 7/1991 |
|---|---|---|
| TW | I362176 B | 4/2012 |

* cited by examiner

*Primary Examiner* — Levi Gannon
(74) *Attorney, Agent, or Firm* — McClure, Qualey & Rodack, LLP

(57) ABSTRACT

An oscillation circuit including an amplifier, a feedback resistor and a first switch circuit is provided. The amplifier inverts and amplifies an oscillation signal received from an input terminal thereof to provide an output oscillation signal at an output terminal thereof. The feedback resistor is coupled between the input terminal and the output terminal, and coupled with the first switch circuit in parallel. The first switch circuit conducts the input terminal to the output terminal in one of the following situations: (1) an input voltage of the oscillation signal is higher than an output voltage of the output oscillation signal by at least a first threshold value; and (2) the output voltage is higher than the input voltage by at least a second threshold value. The first switch circuit has a first on-state resistance smaller than a resistance of the feedback resistor.

20 Claims, 9 Drawing Sheets

OSCILLATION CIRCUIT AND METHOD OF AUTOMATIC DUTY CYCLE CALIBRATION

BACKGROUND

Technical Field

The present disclosure relates to an electronic oscillator. More particularly, the present disclosure relates to a oscillation circuit and a method of automatic duty cycle calibration.

Description of Related Art

A conventional quartz oscillation system (e.g., the Pierce oscillator) includes an amplifier and a quartz crystal which cooperate with each other to generate an oscillation signal. To retain a duty cycle of the oscillation signal at 50%, an input node of the amplifier is usually biased at a fixed voltage. As the semiconductor manufacturing process advanced, the size of transistors is continuously decreased to realize high-speed and high-frequency circuits. However, in the quartz oscillation system fabricated by the advanced manufacturing process, the transistors thereof have significant gate leakages which may cause the input terminal of the amplifier shift from the fixed voltage, causing the duty cycle of the oscillation signal to deviate from 50%.

A frequency doubler used to increase the frequency of the oscillation signal may be coupled at the output terminal of the amplifier. In some circumstances, the frequency doubler may calibrate the duty cycle of the oscillation signal. Nevertheless, as the deviation of the duty cycle of the oscillation signal increases, the frequency doubler usually needs a more complicate structure to improve the capability of calibration, which not only leads to an increase of the overall circuit area, but introduces more noises. Therefore, such way of calibration does not applicable to the quartz oscillation system made by the advanced manufacturing process.

SUMMARY

The disclosure provides an oscillation circuit including an amplifier, a feedback resistor and a first switch circuit. The amplifier includes an input terminal and an output terminal, and is configured to invert and to amplify an oscillation signal received from the input terminal to provide an output oscillation signal at the output terminal. The feedback resistor is coupled between the input terminal and the output terminal. The first switch circuit is coupled with the feedback resistor in parallel, and is configured to conduct the input terminal and the output terminal to each other in one of the following situations: (1) an input voltage of the oscillation signal is higher than an output voltage of the output oscillation signal by at least a first threshold value; and (2) the output voltage is higher than the input voltage by at least a second threshold value. In addition, the first switch circuit has a first on-state resistance smaller than a resistance of the feedback resistor.

The disclosure provides a method of automatic duty cycle calibration. The method includes the following operations: receiving an oscillation signal by an input terminal of an amplifier; inverting and amplifying the oscillation signal by the amplifier to provide an output oscillation signal at an output terminal of the amplifier; conducting a first switch circuit coupled between the input terminal and the output terminal in one of the following situations: (1) an input voltage of the oscillation signal is higher than an output voltage of the output oscillation signal by at least a first threshold value; and (2) the output voltage is higher than the input voltage by at least a second threshold value. In addition, a feedback resistor is coupled between the input terminal and the output terminal, and the first switch circuit has a first on-state resistance smaller than a resistance of the feedback resistor.

It is to be understood that both the foregoing general description and the following detailed description are by examples, and are intended to provide further explanation of the disclosure as claimed.

DETAILED DESCRIPTION

Figure 1:
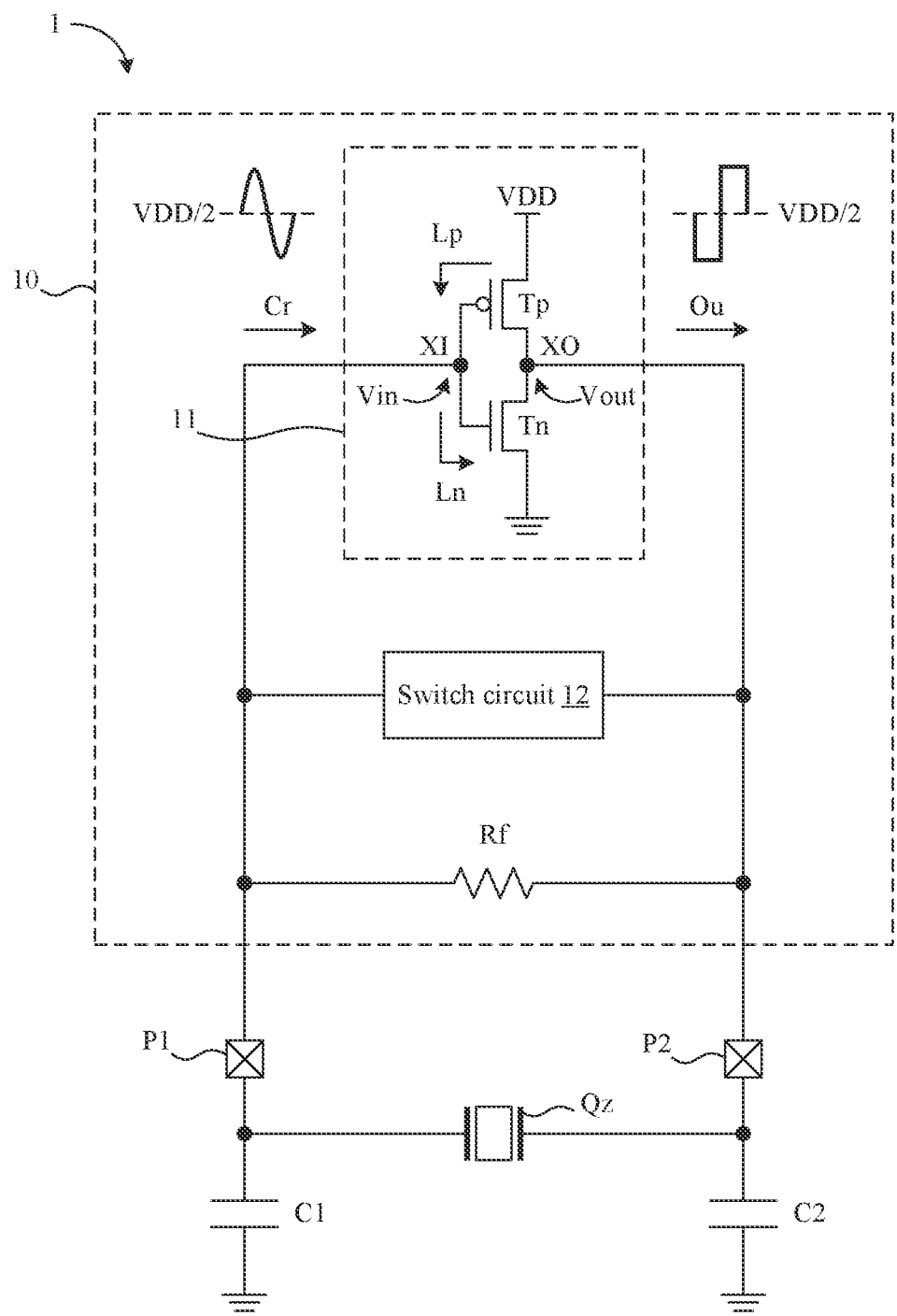
FIG. 1 is a simplified functional block diagram of an oscillation system according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified functional block diagram of an oscillation system 1 according to an embodiment of the present disclosure. The oscillation system 1 comprises an oscillation circuit 10, a first pin P1, a second pin P2, a quartz crystal Qz, a first capacitor C1 and a second capacitor C2. The oscillation circuit 10 is configured to form a feedback system with the quartz crystal Qz so as to generate an output oscillation signal Ou based on a crystal oscillation signal Cr received from the quartz crystal Qz. For the sake of brevity, other functional blocks of the oscillation system 1 are not shown in FIG. 1.

The oscillation circuit 10 is configured to be coupled with a first terminal of the quartz crystal Qz and the first capacitor C1 through the first pin P1, and configured to be coupled with a second terminal of the quartz crystal Qz and the second capacitor C2 through the second pin P2. In some embodiments, the oscillation circuit 10 may be encapsulated in a chip, and the first pin P1 and the second pin P2 may be connection pads of the chip. The oscillation circuit 10 comprises an amplifier 11, a switch circuit 12 and a feedback resistor Rf. The amplifier 11 comprises an input terminal XI and an output terminal XO configured to be coupled with the first pin P1 and the second pin P2, respectively. The input terminal XI is configured to receive the crystal oscillation signal Cr from the quartz crystal Qz through the first pin P1. The amplifier 11 is configured to amplify and invert the crystal oscillation signal Cr to provide the output oscillation signal Ou at the output terminal XO, in which the output oscillation signal Ou is transmitted to the quartz crystal Qz through the second pin P2.

In this embodiment, the amplifier 11 is realized by an inverter comprising a transistor Tn and a transistor Tp, but this disclosure is not limited thereto. The amplifier 11 may be realized by various inverting amplifiers in some embodiments. The transistor Tn is coupled between a ground node and the output terminal XO, in which the ground node may provide a ground voltage. The transistor Tp is coupled between a power node and the output terminal XO, in which the power node is configured to provide an operating voltage VDD. In addition, control terminals of the transistors Tp and Tn are coupled with the input terminal XI.

The feedback resistor Rf is coupled between the input terminal XI and the output terminal XO, and configured to provide a negative feedback to set a direct current (DC) bias voltage of the input terminal XI (represented by the broken line) so as to bias the transistor Tp and the transistor Tn in the linear region. The DC bias voltage may be half of the operating voltage VDD (VDD/2) which is the same as a DC bias voltage of the output terminal XO, and thus the output oscillation signal Ou would have a 50% duty cycle, but this disclosure is not limited thereto. To start the oscillation, the oscillation circuit 10 requires a positive feedback provided by the first capacitor C1 and the second capacitor C2, and therefore the feedback resistor Rf may have a relative large resistance to mitigate the negative feedback so that the positive feedback would not be canceled. In some embodiments, the feedback resistor Rf may have a resistance range of 1 million ohm (MΩ) to 10 MΩ.

As shown in FIG. 1, the crystal oscillation signal Cr and the output oscillation signal Ou have phases approximately opposite to each other. In a positive half cycle of the crystal oscillation signal Cr, the transistor Tn is conducted and may have a leakage current Ln. Similarly, the transistor Tp may have a leakage current Lp in a negative half cycle of the crystal oscillation signal Cr. The leakage currents Ln and Lp may cause the DC bias voltage of the input terminal XI to decrease and increase, respectively, and therefore deviating from half of the operating voltage VDD. The switch circuit 12, which is coupled between the input terminal XI and the output terminal XO and coupled with the feedback resistor Rf in parallel, is capable of stabilizing the DC bias voltage of the input terminal XI at half of the operating voltage VDD.

A voltage of the crystal oscillation signal Cr (e.g., the sinusoidal wave of FIG. 1, hereinafter referred to as the "input voltage Vin") may swing based on the DC bias voltage of the input terminal XI, and a voltage of the output oscillation signal Ou (e.g., the square wave of FIG. 1, hereinafter referred to as the "output voltage Vout") may swing based on the DC bias voltage of the output terminal XO. The switch circuit 12 may detect a voltage difference between the input voltage Vin and the output voltage Vout so as to conduct in one of the situations: (1) the input voltage Vin is higher than the output voltage Vout by at least a first threshold value Vtha (depicted in FIGS. 5); and (2) the output voltage Vout is higher than the input voltage Vin by at least a second threshold value Vthb (depicted in FIG. 9). The switch circuit 12 which is conducted in the first situation is capable of calibrating the voltage deviation caused by the leakage current Ln. On the other hand, if the switch circuit 12 is designed to be conducted in the second situation, the switch circuit 12 is capable of calibrating the voltage deviation caused by the leakage current Lp.

In specific, when the switch circuit 12 is conducted, the conducted switch circuit 12 is operated as an equivalent resistor coupled with the feedback resistor Rf in parallel. The switch circuit 12 has an on-state resistance smaller than a resistance of the feedback resistor Rf to decrease a total resistance Rt (depicted in FIGS. 5 and 9) between the input terminal XI and the output terminal XO. As a result, the deviated DC bias voltage of the input terminal XI would be stabilized by the DC bias voltage of the output terminal XO which substantially remains half of the operating voltage VDD so as to realize an automatic voltage calibration. In some embodiments, the resistance of the feedback resistor Rf is 10-500 times the on-state resistance of the switch circuit 12.

Figure 2:
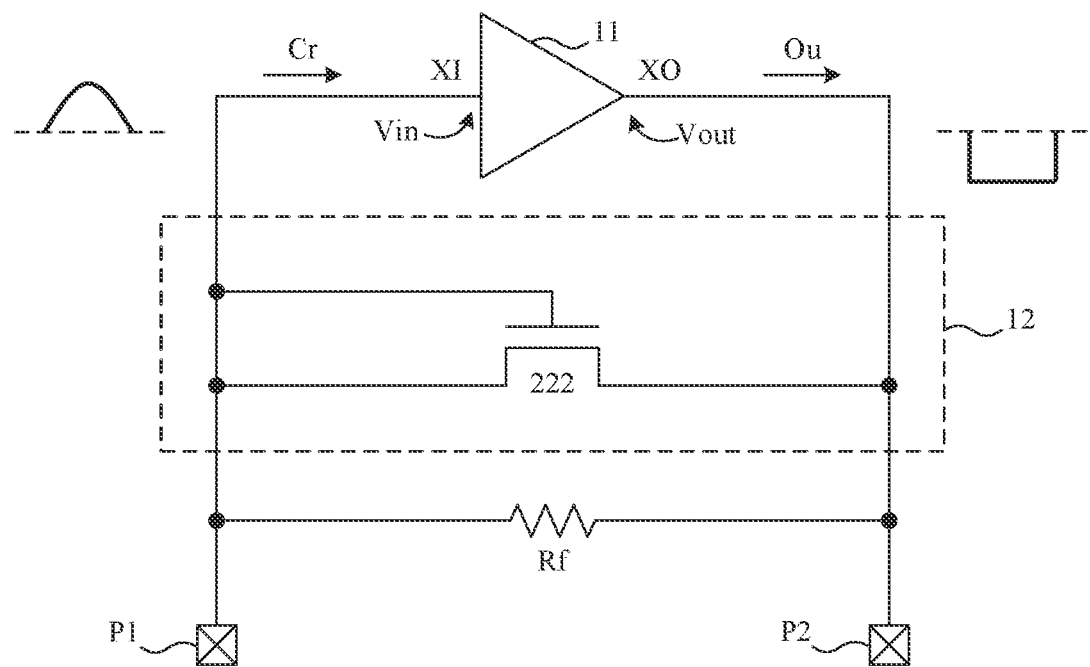
FIG. 2 is a schematic diagram of a switch circuit according to an embodiment of the present disclosure.
Figure 3:
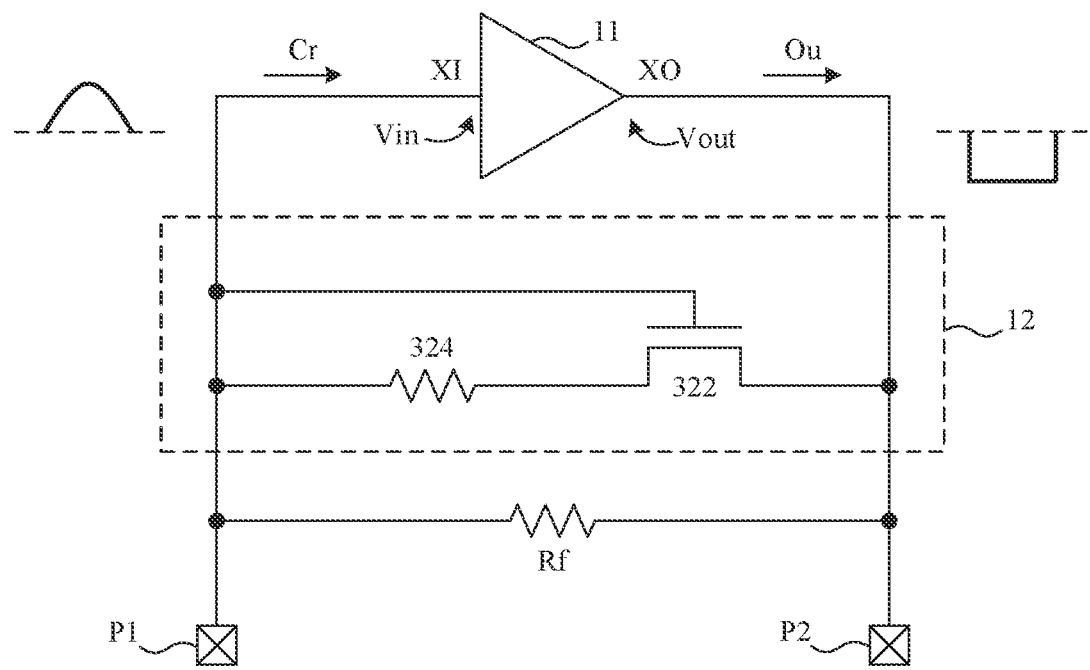
FIG. 3 is a schematic diagram of a switch circuit according to an embodiment of the present disclosure.
Figure 4:
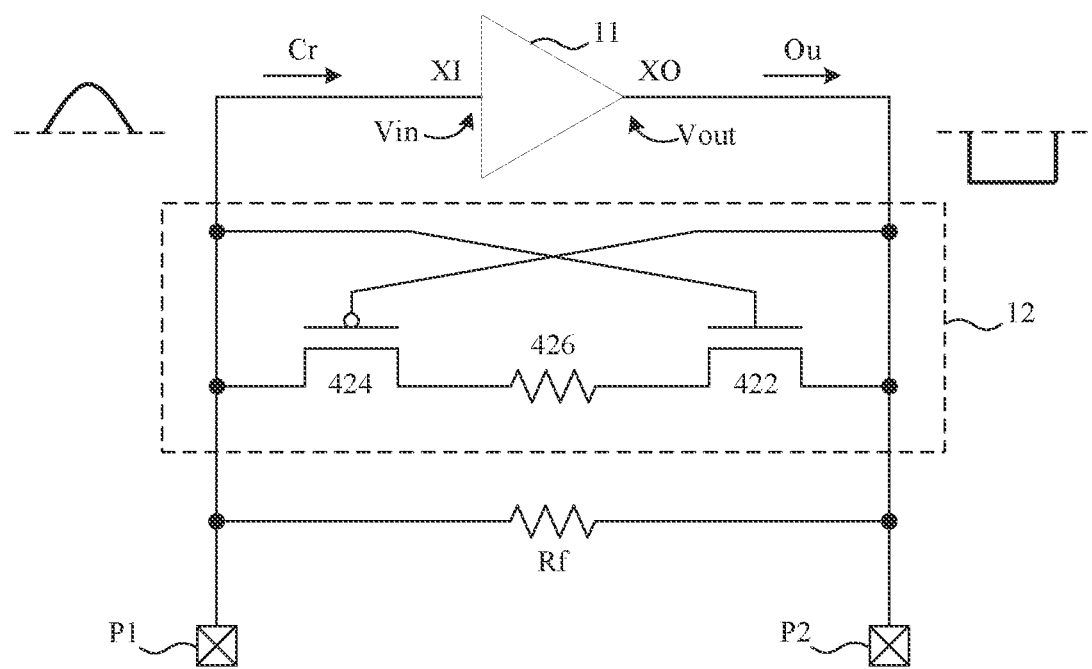
FIG. 4 is a schematic diagram of a switch circuit according to an embodiment of the present disclosure.

Reference is made to FIGS. 2-4. The following paragraphs first illustrate embodiments that the switch circuit 12 is conducted in the first situation that the input voltage Vin is higher than the output voltage Vout.

FIGS. 2-4 shows schematic diagrams of the switch circuit 12, according to some embodiments of the present disclosure. Reference is made to FIG. 2. In this embodiment, the switch circuit 12 comprises a transistor 222, in which the transistor 222 comprises a first terminal, a second terminal and a control terminal. In some embodiments, the transistor 222 may be an N-type transistor. The first terminal and the control terminal of the transistor 222 are coupled with the input terminal XI, and the second terminal of the transistor 222 is coupled with the output terminal XO. The transistor 222 forms a diode connection so that the switch circuit 12 of this embodiment is conducted in the positive half cycle of the crystal oscillation signal Cr. More specific, the switch circuit 12 of this embodiment is conducted when the input voltage Vin is higher than the output voltage Vout by at least a threshold voltage of the transistor 222. Therefore, the first threshold value Vtha of the aforementioned first situation may be the threshold voltage of the transistor 222. In addition, the on-state resistance of the switch circuit 12 of this embodiment may be an on-state resistance of the transistor 222, which is the source-drain resistance of the transistor 222 when conducted.

Next, reference is made to FIG. 3. In this embodiment, the switch circuit 12 comprises a transistor 322 and a compensation resistor 324 connected in series between the input terminal XI and the output terminal XO, in which the transistor 322 comprises a first terminal, a second terminal and a control terminal. In some embodiments, the transistor 322 may be an N-type transistor. The compensation resistor 324 is coupled between the input terminal XI and the transistor 322. The first terminal, the second terminal and the control terminal of the transistor 322 are coupled with the compensation resistor 324, the output terminal XO and the input terminal XI, respectively. In some embodiments, positions of the transistor 322 and the compensation resistor 324 may be swapped with each other. Similar to those discussed in FIG. 2, the switch circuit 12 in this embodiment is conducted when the input voltage Vin is higher than the output voltage Vout by at least a threshold voltage of the transistor 322, and therefore the first threshold value Vtha of the aforementioned first situation may be the threshold voltage of the transistor 322. The on-state resistance of the switch circuit 12 in this embodiment may be a sum of an on-state resistance of the transistor 322 and a resistance of the compensation resistor 324.

Reference is made to FIG. 4. In this embodiment, the switch circuit 12 comprises a transistor 422, a transistor 424 and a compensation resistor 426, in which each of the transistors 422 and 424 has a first terminal, a second terminal and a control terminal. In some embodiments, the transistor 422 may be an N-type transistor, and the transistor 424 may be a P-type transistor. The compensation resistor 426 is coupled between the transistor 422 and the transistor 424. The first terminal, the second terminal and the control terminal of the transistor 422 are coupled with the compensation resistor 426, the output terminal XO and the input terminal XI, respectively. The first terminal, the second terminal and the control terminal of the transistor 424 are coupled with the input terminal XI, the compensation resistor 426 and the output terminal XO, respectively. The switch circuit 12 of this embodiment may be conducted when the input voltage Vin is higher than the output voltage Vout by at least a threshold voltage of the transistor 422 or by at least an absolute value of a threshold voltage of the transistor 424. That is, the first threshold value Vtha of the aforementioned first situation may be the threshold voltage of the transistor 422 or the absolute value of the threshold voltage of the transistor 424. The on-state resistance of the switch circuit 12 of this embodiment may be a sum of an on-state resistance of the transistor 422, an on-state resistance of the transistor 424 and a resistance of the compensation resistor 426.

In some embodiments, the compensation resistor 426 of FIG. 4 may be omitted. The first terminal of the transistor 422 may be directly coupled to the second terminal of the transistor 424.

Figure 5:
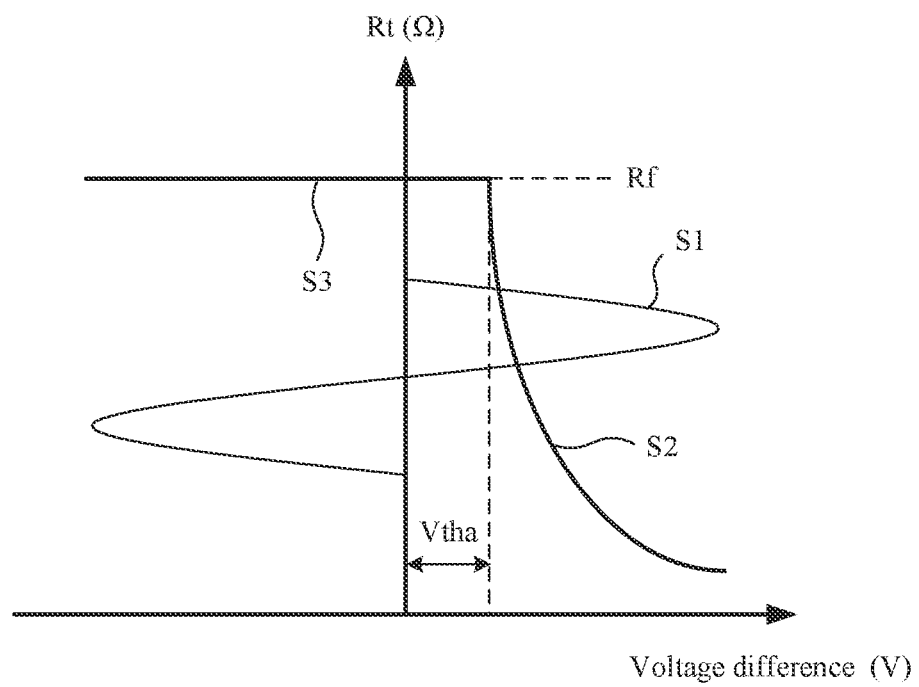
FIG. 5 is schematic diagram showing a total resistance between an input terminal and an output terminal according to an embodiment of the present disclosure.

FIG. 5 is a schematic diagram showing the total resistance Rt between the input terminal XI and the output terminal XO provided by the switch circuit 12 and the feedback resistor Rf, according to an embodiment of the present disclosure. In this embodiment, the switch circuit 12 may be realized by any one of those in the embodiments of FIGS. 2-4. A voltage difference of subtracting the input voltage Vin by the output voltage Vout is represented by a curve S1. A curve S2 represents the total resistance Rt of the situation that the switch circuit 12 is conducted. A line S3 represents the total resistance Rt of the situation that the switch circuit 12 is switched off.

As shown in FIG. 5, when the input voltage Vin is not higher than the output voltage Vout by the first threshold value Vtha, the switch circuit 12 is switched-off and therefore the total resistance Rt is the resistance of the feedback resistor Rf (line S3).

On the other hand, when the input voltage Vin is higher than the output voltage Vout by at least the first threshold value Vtha, the switch circuit 12 is conducted and therefore the total resistance Rt is composed of the on-state resistance of the switch circuit 12 and the resistance of the feedback resistor Rf (curve S2). In this situation, the total resistance Rt may be presented as Formula I:

$$Rt = \frac{1}{\frac{1}{Rost} + \frac{1}{Rf}} \quad \text{Formula I}$$

The symbol "Rost" in Formula I represents the on-state resistance of the switch circuit 12.

In addition, since the on-state resistance of a transistor may vary with the source-drain voltage, the on-state resistance of the switch circuit 12 (when being realized by those in the embodiments of FIGS. 2-4) is negatively correlated with the input voltage Vin when the input voltage Vin is higher than the output voltage Vout. For example, with respect to the switch circuit 12 in the embodiment of FIG. 4, the total resistance Rt when the switch circuit 12 of FIG. 4 is conducted may be presented as Formula II:

$$Rt = \frac{1}{\frac{1}{Rost} + \frac{1}{Rf}} = \frac{1}{\frac{1}{Rc + Ron + Rop} + \frac{1}{Rf}} \quad \text{Formula II}$$

The symbols "Rc," "Ron," and "Rop" represent the resistance of the compensation resistor 426, the on-state resistance of the transistor 422 and the on-state resistance of the transistor 424, respectively. The on-state resistance of the transistor 422 and the on-state resistance of the transistor 424 decrease as the input voltage Vin increases, resulting that the on-state resistance of the switch circuit 12 of FIG. 4 is negatively correlated with the input voltage Vin. As such, the total resistance Rt between the input terminal XI and the output terminal XO decreases as the input voltage Vin increases. Lowering the total resistance Rt results that the DC bias voltage of the input terminal XI becomes easier to be stabilized by the DC bias voltage of the output terminal XO, which helps to deal with the influence of the greater leakage current Ln induced by the high input voltage Vin.

Figure 6:
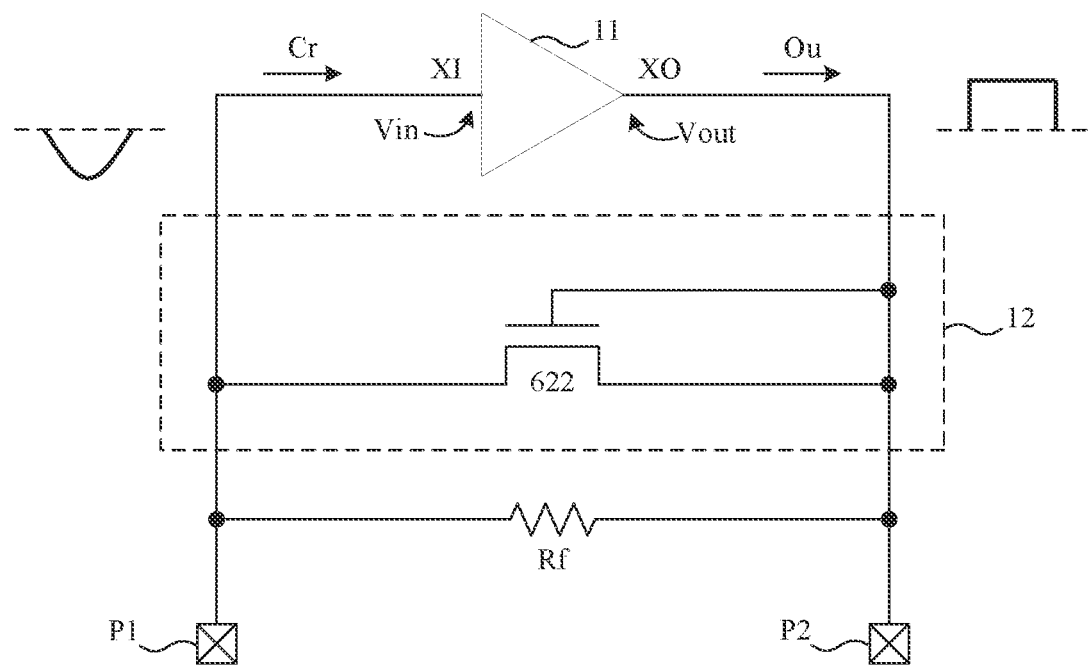
FIG. 6 is a schematic diagram of a switch circuit according to an embodiment of the present disclosure.
Figure 7:
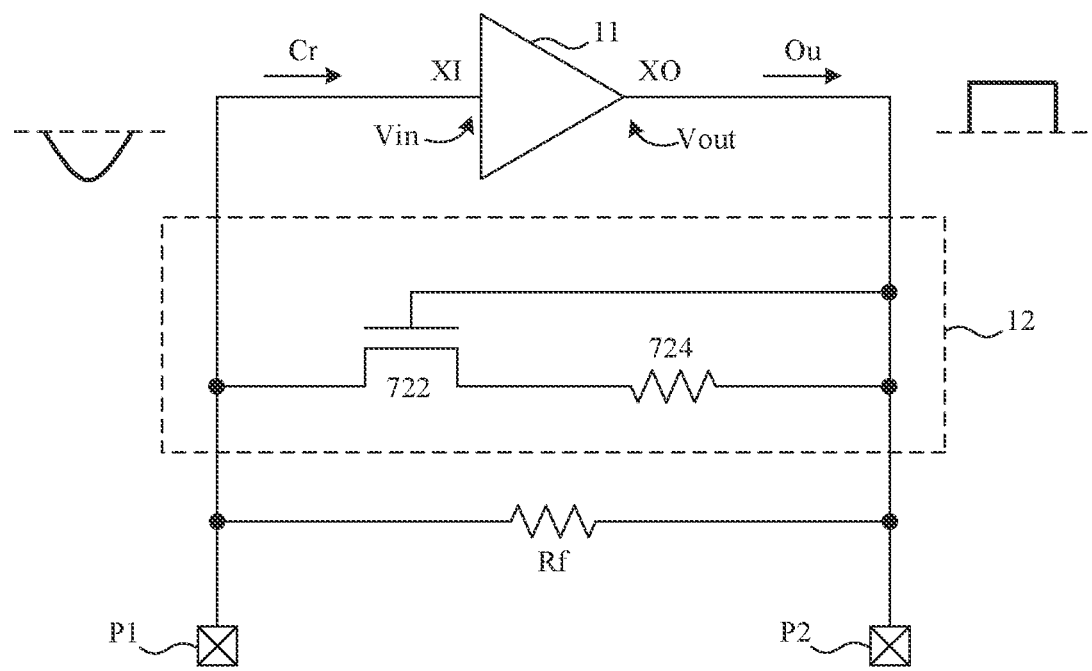
FIG. 7 is a schematic diagram of a switch circuit according to an embodiment of the present disclosure.
Figure 8:
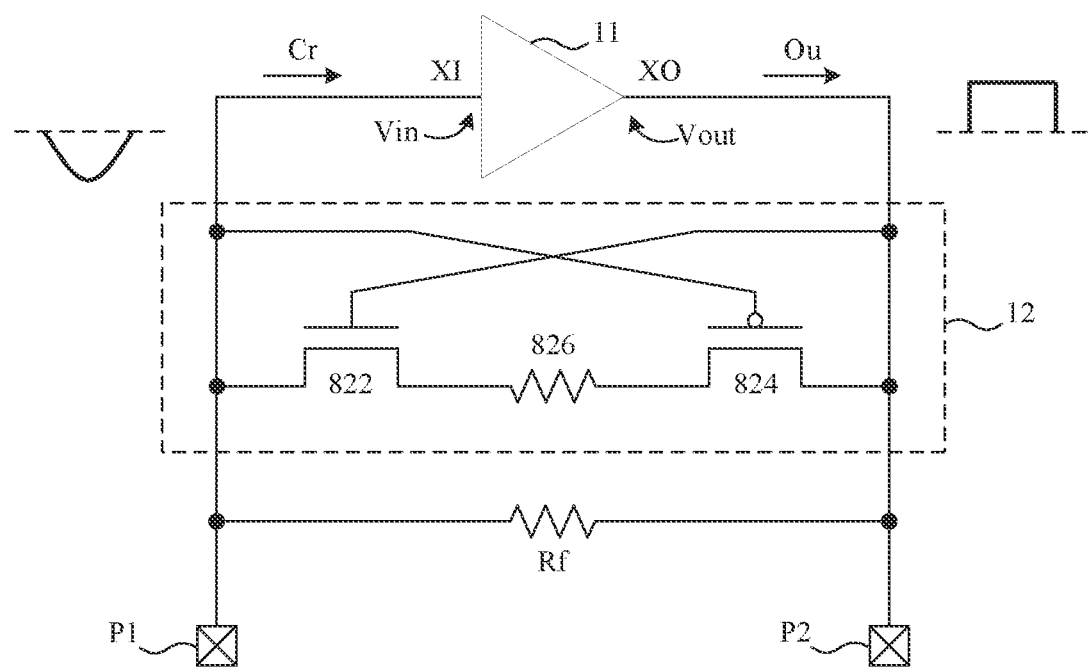
FIG. 8 is a schematic diagram of a switch circuit according to an embodiment of the present disclosure.

Reference is made to FIGS. 6-8. In the following embodiments, the switch circuit 12 is conducted in the aforesaid second situation to mitigate the influence of the leakage current Lp.

FIGS. 6-8 shows schematic diagrams of the switch circuit 12 according to some embodiments of the present disclosure. Reference is made to FIG. 6. In this embodiment, the switch circuit 12 comprises a transistor 622, in which the transistor 622 comprises a first terminal, a second terminal and a control terminal. In some embodiments, the transistor 622 may be an N-type transistor. The first terminal of the transistor 622 is coupled with the input terminal XI, and the second terminal and the control terminal of the transistor 622 are coupled with the output terminal XO. The transistor 622 forms a diode connection so that the switch circuit 12 of this embodiment is conducted in the negative half cycle of the crystal oscillation signal Cr. That is, the switch circuit 12 of this embodiment is conducted when the output voltage Vout is higher than the input voltage Vin by at least a threshold voltage of the transistor 622. Therefore, the second threshold value Vthb of the aforementioned second situation may be the threshold voltage of the transistor 622. In addition, the on-state resistance of the switch circuit 12 of this embodiment may be an on-state resistance of the transistor 622.

Reference is made to FIG. 7. In this embodiment, the switch circuit 12 comprises a transistor 722 and a compensation resistor 724 coupled in series between the input terminal XI and the output terminal XO, in which the transistor 722 comprises a first terminal, a second terminal and a control terminal. In some embodiments, the transistor 722 may be an N-type transistor. The compensation resistor 724 is coupled between the transistor 722 and the output terminal XO. The first terminal, the second terminal and the control terminal of the transistor 722 are coupled with the input terminal XI, the compensation resistor 724, and the output terminal XO, respectively. In some embodiments, positions of the transistor 722 and the compensation resistor 724 may be swapped with each other. Similar to those described with reference to FIG. 6, the switch circuit 12 of this embodiment is conducted when the output voltage Vout is higher than the input voltage Vin by at least a threshold voltage of the transistor 722. Therefore, the second threshold value Vthb of the aforementioned second situation may be the threshold voltage of the transistor 722. In addition, an on-state resistance of the switch circuit 12 of this embodiment may be a sum of an on-state resistance of the transistor 722 and a resistance of the compensation resistor 724.

Reference is made to FIG. 8. In this embodiment, the switch circuit 12 comprises a transistor 822, a transistor 824 and a compensation resistor 826, in which each of the transistors 822 and 824 comprises a first terminal, a second terminal and a control terminal. In some embodiments, the transistor 822 may be an N-type transistor, and the transistor 824 may be a P-type transistor. The compensation resistor 826 is coupled between the transistor 822 and the transistor 824. The first terminal, the second terminal and the control terminal of the transistor 822 are coupled with the input terminal XI, the compensation resistor 826 and the output terminal XO, respectively. The first terminal, the second terminal and the control terminal of the transistor 824 are coupled with the compensation resistor 826, the output terminal XO and the input terminal XI, respectively. The switch circuit 12 of this embodiment may be conducted when the output voltage Vout is higher than the input voltage Vin by at least a threshold voltage of the transistor 822 or by at least an absolute value of a threshold voltage of the transistor 824. That is, the second threshold value Vthb of the aforementioned second situation may be the threshold voltage of the transistor 822 or the absolute value of the threshold voltage of the transistor 824. The on-state resistance of the switch circuit 12 of this embodiment may be a sum of an on-state resistance of the transistor 822, an on-state resistance of the transistor 824 and a resistance of the compensation resistor 826.

In some embodiments, the compensation resistor 826 of FIG. 8 may be omitted. The second terminal of the transistor 822 may be directly coupled to the first terminal of the transistor 824.

Figure 9:
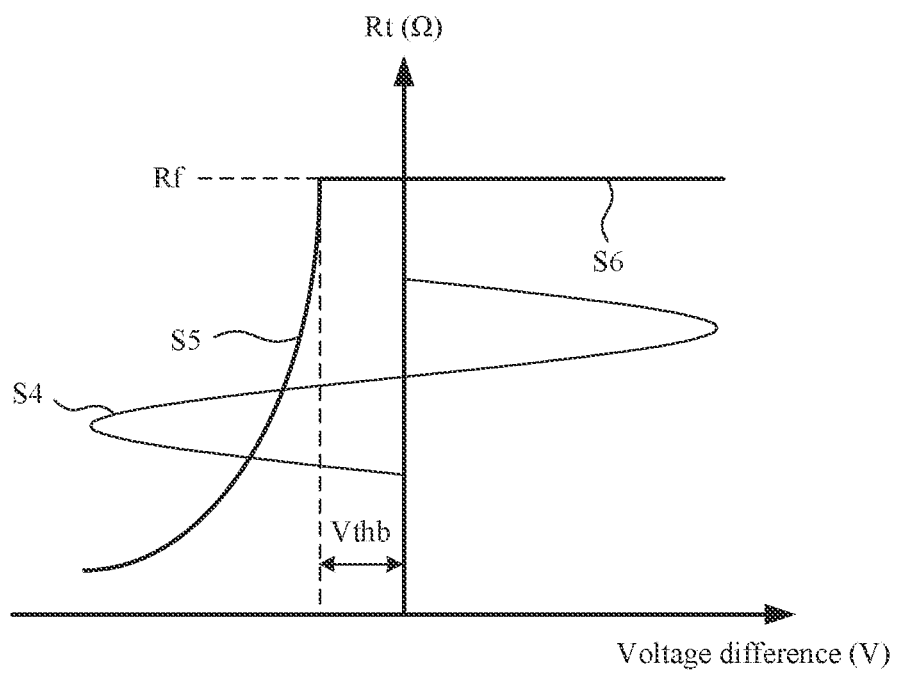
FIG. 9 is a schematic diagram showing the total resistance between the input terminal and the output terminal according to an embodiment of the present disclosure.

FIG. 9 is a schematic diagram showing the total resistance Rt between the input terminal XI and the output terminal XO provided by the switch circuit 12 and the feedback resistor Rf, according to an embodiment of the present disclosure. In this embodiment, the switch circuit 12 may be realized by any one of those in the embodiments of FIGS. 6-8. A voltage difference of subtracting the input voltage Vin by the output voltage Vout is represented by a curve S4. A curve S5 represents the total resistance Rt of the situation that the switch circuit 12 is conducted. A line S6 represents the total resistance Rt of the situation that the switch circuit 12 is switched off.

As shown in FIG. 9, when the output voltage Vout is not higher than the input voltage Vin by the second threshold value Vthb, the switch circuit 12 is switched-off and therefore the total resistance Rt is the resistance of the feedback resistor Rf (line S6).

On the other hand, when the output voltage Vout is higher than the input voltage Vin by at least the second threshold value Vthb, the switch circuit 12 is conducted and therefore the total resistance Rt is composed of the on-state resistance of the switch circuit 12 and the resistance of the feedback resistor Rf (curve S5).

In addition, since the on-state resistance of a transistor may vary with the source-drain voltage, the on-state resistance of the switch circuit 12 (when being realized by those in the embodiments of FIGS. 6-8) is positively correlated with the input voltage Vin when the output voltage Vout is higher than the input voltage Vin. As such, the total resistance Rt between the input terminal XI and the output terminal XO decreases when the input voltage Vin decreases. Lowering the total resistance Rt when the input voltage Vin decreases helps to deal with the influence of the greater leakage current Lp induced by the low input voltage Vin.

In some embodiments, the transistors of the switch circuit 12 in the embodiments of FIGS. 2-3 may be realized by P-type transistors, so that the switch circuit 12 in the embodiments of FIGS. 2-3 may be conducted in the second situation to mitigate the influence of the leakage current Lp.

In other embodiments, the transistors of the switch circuit 12 in the embodiments of FIGS. 6-7 may be realized by P-type transistors, so that the switch circuit 12 in the embodiments of FIGS. 6-7 may be conducted in the first situation to mitigate the influence of the leakage current Ln.

Figure 10:
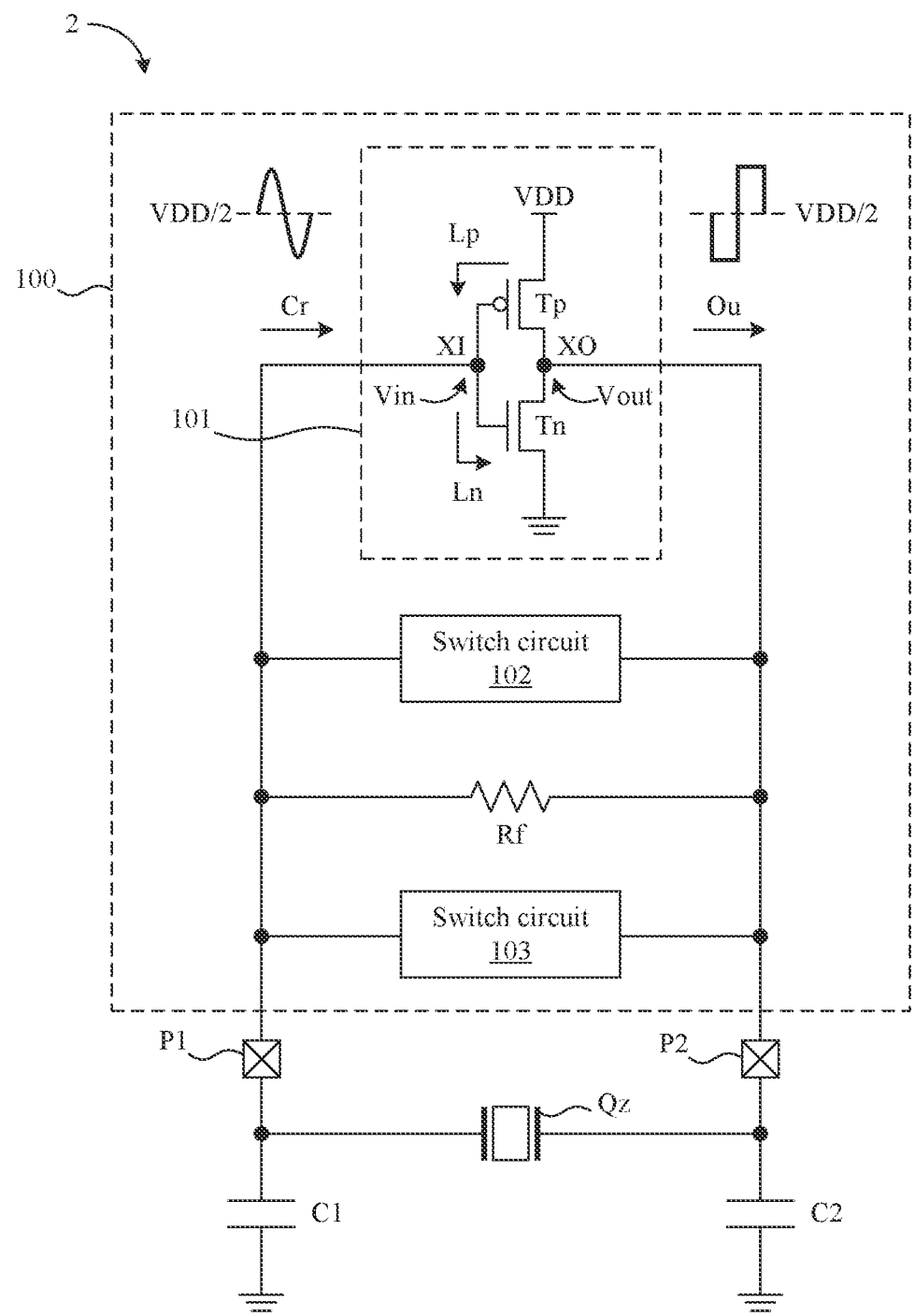
FIG. 10 is a simplified functional block diagram of an oscillation system according to an embodiment of the present disclosure.

FIG. 10 is a simplified functional block diagram of an oscillation system 2 according to an embodiment of the present disclosure. The oscillation system 2 comprises an oscillation circuit 100, and also comprises the first pin P1, the second pin P2, the quartz crystal Qz, the first capacitor C1 and the second capacitor C2 which are discussed above with reference to FIG. 1. For the sake of brevity, other functional blocks of the oscillation system 2 are not shown in FIG. 10. The oscillation circuit 100 is configured to form a feedback system with the quartz crystal Qz so as to generate an output oscillation signal Ou based on a crystal oscillation signal Cr received from the quartz crystal Qz. The oscillation circuit 100 comprises an amplifier 101, a feedback resistor Rf, and switch circuits 102 and 103. The oscillation circuit 100 of FIG. 10 is similar to the oscillation circuit 10 of FIG. 1, and therefore descriptions regarding to components of FIG. 10 whose corresponding components are described above with reference to FIG. 1 are omitted below.

Each of the switch circuits 102 and 103 is coupled between the input terminal XI and the output terminal XO (i.e., coupled with the feedback resistor Rf in parallel). The switch circuit 102 is configured to be conducted when the input voltage Vin is higher than the output voltage Vout by at least the first threshold value Vtha (i.e., the first situation) to mitigate the influence of the leakage current Ln. On the other hand, the switch circuit 103 is configured to be conducted when the output voltage Vout is higher than the input voltage Vin by at least the second threshold value Vthb (i.e., the second situation) to mitigate the influence of the leakage Lp. Each of the switch circuits 102 and 103 has an on-state resistance smaller than the resistance of the feedback resistor Rf.

In some embodiments, the switch circuit 102 may be realized by the switch circuit 12 in any one of the embodiments of FIGS. 2-4, or by the switch circuit 12 in any one of the embodiments of FIGS. 6-7 with their transistors realized by P-type transistors. The switch circuit 103 may be realized by the switch circuit 12 in any one of the embodiments of FIGS. 6-8, or by the switch circuit 12 in any one of the embodiments of FIGS. 2-3 with their transistors realized by P-type transistors. The implementation that the switch circuits 102 and 103 are realized by the switch circuit 12 of FIG. 4 and the switch circuit 12 of FIG. 8, respectively, is illustrated with reference to FIG. 11.

Figure 11:
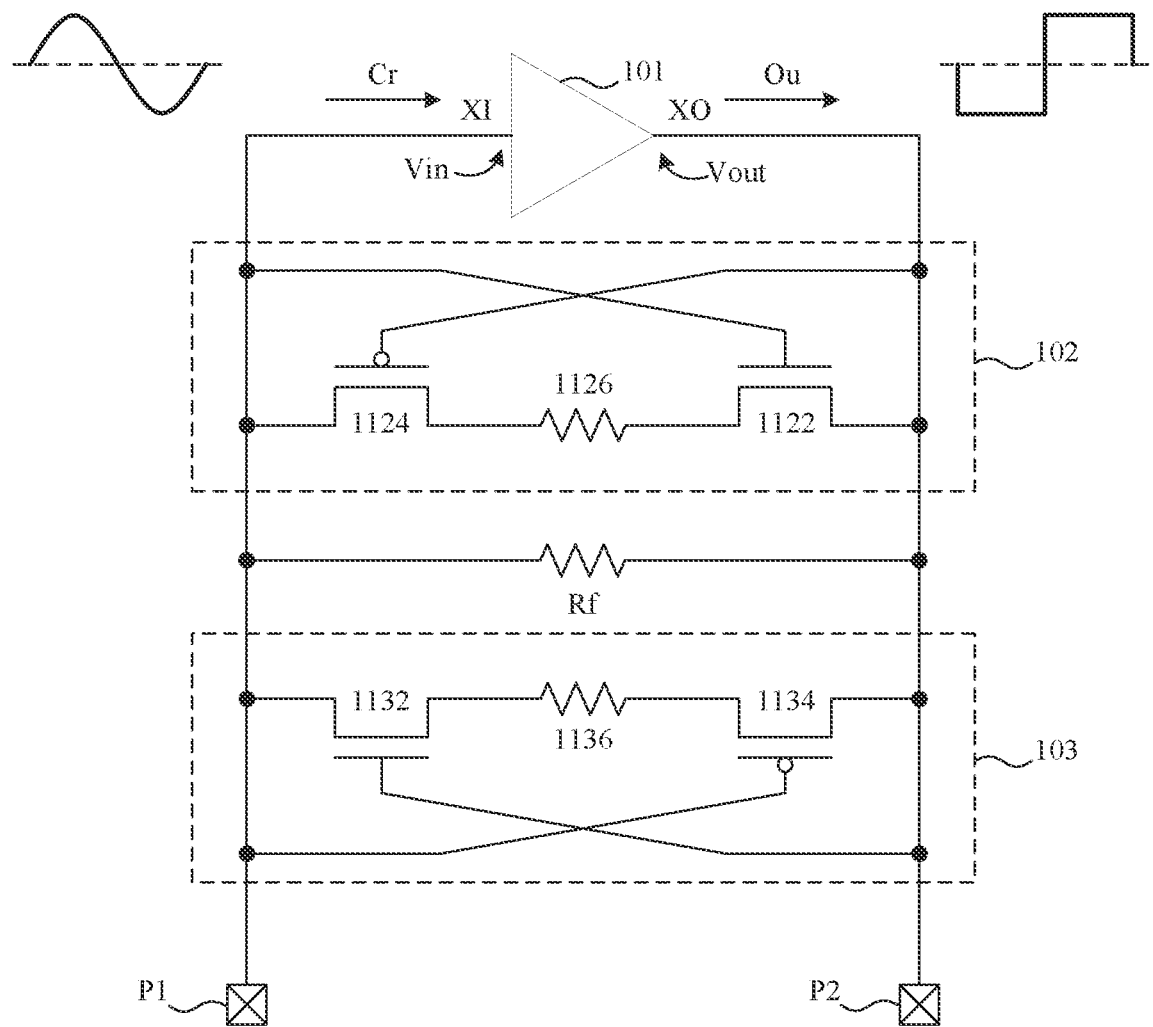
FIG. 11 shows schematic diagrams of switch circuits according to an embodiment of the present disclosure.

FIG. 11 shows schematic diagrams of the switch circuit 102 and the switch circuit 103 according to an embodiment of the present disclosure. The switch circuit 102 comprises a transistor 1122, a transistor 1124, and a compensation resistor 1126, in which each of the transistors 1122 and 1124 comprises a first terminal, a second terminal and a control terminal. In some embodiments, the transistor 1122 may be an N-type transistor, and the transistor 1124 may be a P-type transistor. The compensation resistor 1126 is coupled between the transistor 1122 and the transistor 1124. The first terminal, the second terminal and the control terminal of the transistor 1122 are coupled with the compensation resistor 1126, the output terminal XO and the input, terminal XI, respectively. The first terminal, the second terminal, and the control terminal of the transistor 1124 are coupled with the input terminal XI, the compensation resistor 1126 and the output terminal XO, respectively.

The switch circuit 103 comprises a transistor 1132, a transistor 1134, and a compensation resistor 1136, in which each of the transistors 1132 and 1134 comprises a first terminal, a second terminal and a control terminal. In some embodiments, the transistor 1132 may be an N-type transistor, and the transistor 1134 may be a P-type transistor. The compensation resistor 1136 is coupled between the transistor 1132 and the transistor 1134. The first terminal, the second terminal and the control terminal of the transistor 1132 are coupled with the input terminal XI, the compensation resistor 826 and the output terminal XO, respectively. The first terminal, the second terminal and the control terminal of the transistor 1134 are coupled with the compensation resistor 1136, the output terminal XO and the input terminal XI, respectively.

The switch circuit 102 may provide a current flow from the input terminal XI to the output terminal XO, and the switch circuit 103 may provide another opposite current flow. That is, the switch circuit 102 is coupled with the switch circuit 103 in an inverse parallel connection to avoid the switch circuits 102 and 103 being simultaneously conducted.

In some embodiments, the compensation resistors 1126 and/or 1136 may be omitted. The first terminal of the transistor 1122 may be directly coupled to the second terminal of the transistor 1124, and the second terminal of the transistor 1132 may be directly coupled to the first terminal of the transistor 1134.

Figure 12:
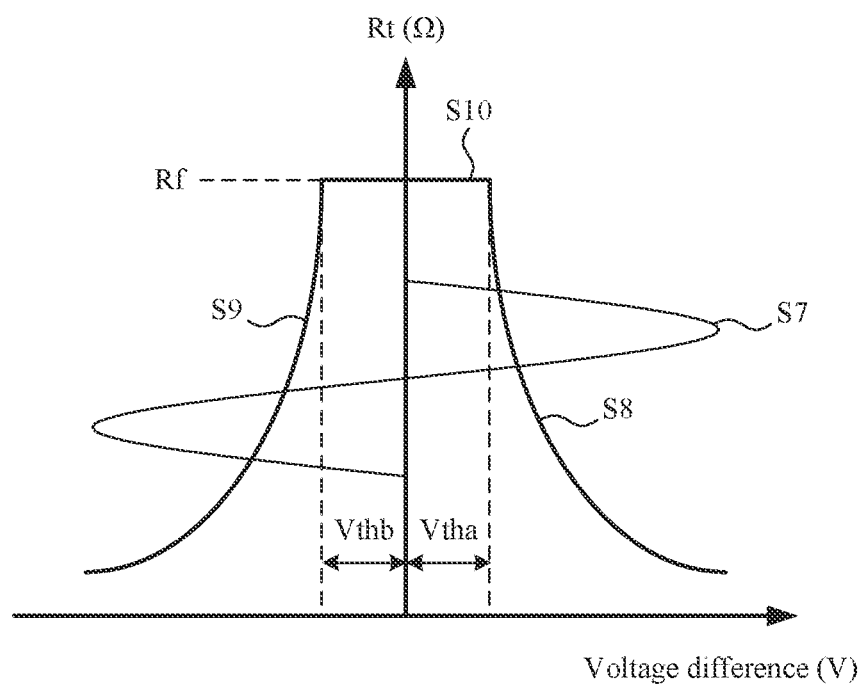
FIG. 12 is a schematic diagram showing the total resistance between the input terminal and the output terminal according to an embodiment of the present disclosure.

FIG. 12 is a schematic diagram showing the total resistance Rt between the input terminal XI and the output terminal XO provided by the switch circuit 102, the switch circuit 103 and the feedback resistor Rf, according to an embodiment of the present disclosure. A voltage difference of subtracting the input voltage Vin by the output voltage Vout is represented by a curve ST A curve S8 represents the total resistance Rt of the situation that the switch circuit 102 is conducted and the switch circuit 103 is switched off. A curve S9 represents the total resistance Rt of the situation that the switch circuit 102 is switched off and the switch circuit 103 is conducted. The line 810 represents the total resistance Rt of the situation that the switch circuit 102 and the switch circuit 103 are both switched off.

As shown in FIG. 12, when the input voltage Vin is higher than the output voltage Vout by at least the first threshold value Vtha, the switch circuit 102 is conducted and the switch circuit 103 is switched off. The total resistance Rt (curve S8) is composed of the on-state resistance of the switch circuit 102 and the resistance of the feedback resistor Rf. Therefore, the total resistance Rt is negatively correlative with the input voltage Vin.

On the other hand, when the output voltage Vout is higher than the input voltage Vin by at least the second threshold value Vthb, the switch circuit 103 is conducted and the switch circuit 102 is switched off. The total resistance Rt (curve S9) is composed of the on-state resistance of the switch circuit 103 and the resistance of the feedback resistor Rf. Therefore, the total resistance Rt is positively correlative with the input voltage Vin.

Further, when the input voltage Vin is higher than the output voltage Vout but the difference between such two voltages is less than the first threshold value Vtha, or when the output voltage Vout is higher than the input voltage Vin but the difference between such two voltages is less than the second threshold value Vthb, both the switch circuit 102 and the switch circuit 103 are switched off. Therefore, the total resistance Rt is the resistance of the feedback resistor Rf.

Some oscillation circuits may be susceptible to noises when the input and output voltages of the amplifier have similar voltage levels (i.e., cross with each other). As can be appreciated from FIGS. 5, 9 and 12, the oscillation circuits 10 and 100 of the above embodiments not only can automatically calibrate the DC bias voltage of the input terminal XI, but can avoid to incorporate additional noises by disabling the calibration operation (i.e., switching off all switch circuits) when the crystal oscillation signal Cr and the output oscillation signal Ou have similar voltage levels.

Figure 13:
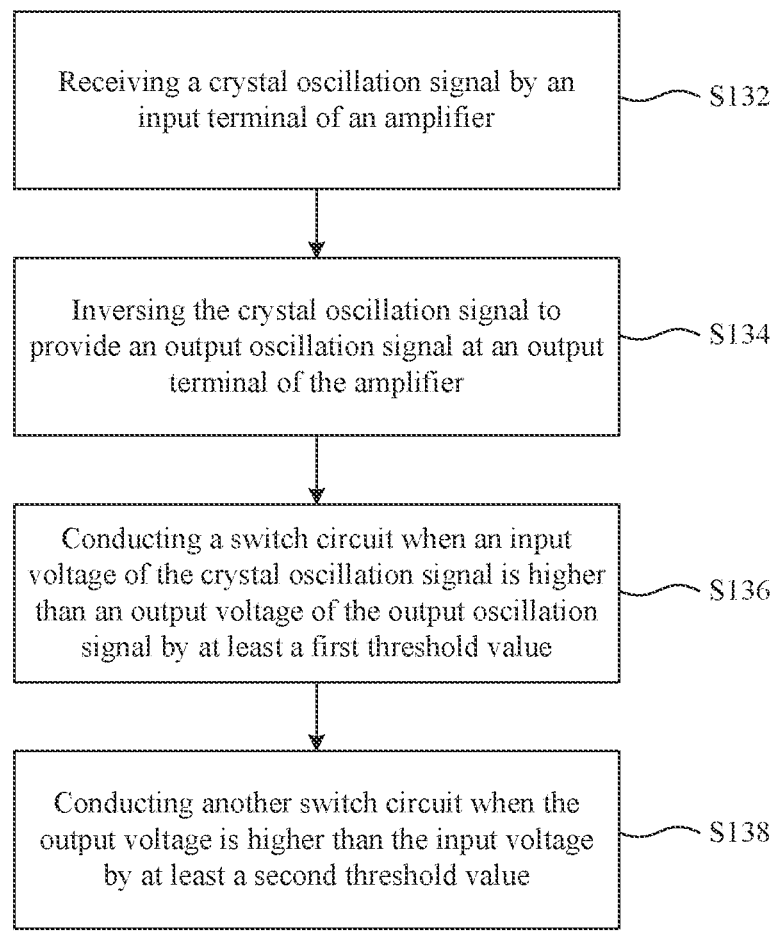
FIG. 13 is a flowchart of a method of automatic duty cycle calibration according to an embodiment of the present disclosure.

FIG. 13 is a flowchart of a method 130 of automatic duty cycle calibration according to an embodiment of the present disclosure. Any combination of the features of the method 130 or any of the other methods described herein may be embodied in instructions stored in a non-transitory computer readable medium. When executed by one or more processors, the instructions may cause some or all of such methods to be performed. It will be understood that any of the methods discussed herein may include greater or fewer operations than illustrated in the flowchart and the operations may be performed in any order, as appropriate. For the convenience of explanation, the method 130 is illustrated with reference to the oscillation circuit 100 of FIG. 10, but this disclosure is not limited thereto. The method 130 is applicable to any one of the oscillation circuits of the above embodiments.

In operation S132, the amplifier 101 receives the crystal oscillation signal Cr by the input terminal XI thereof from the quartz crystal Qz.

In operation S134, the amplifier 101 provides the output oscillation signal Ou at the output terminal XO thereof, by inverting the crystal oscillation signal Cr.

In operation S136, the switch circuit 102 is conducted according to the voltage difference between the input voltage Vin and the output voltage Vout. In specific, the switch circuit 102 is configured to be conducted in one of the situations: (1) when the input voltage Vin is higher than the output voltage Vout by at least the first threshold value Vtha; and (2) when the output voltage Vout is higher than the input voltage Vin by at least the second threshold value Vthb. For example, the switch circuit 102 may be conducted when the input voltage Vin is higher than the output voltage Vout by at least the first threshold value Vtha.

In operation S138, the switch circuit 103 is conducted according to the voltage difference between the input voltage Vin and the output voltage Vout. The switch circuit 103 is configured to be conducted in the other one of the above situations. For example, the switch circuit 103 may be conducted when the output voltage Vout is higher than the input voltage Vin by at least the second threshold value Vthb.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the present disclosure will be apparent to those skilled in the art from consideration of the specification and practice of the present disclosure disclosed herein. It is intended that the specification and examples be considered as exemplary only, with a true scope and spirit of the present disclosure being indicated by the following claims.

What is claimed is:

1. An oscillation circuit, comprising:
   an amplifier, comprising an input terminal and an output terminal, configured to invert and to amplify an oscillation signal received from the input terminal to provide an output oscillation signal at the output terminal;
   a feedback resistor, coupled between the input terminal and the output terminal; and
   a first switch circuit, coupled with the feedback resistor in parallel, configured to conduct the input terminal and the output terminal to each other in one of a plurality of situations:
   (1) an input voltage of the oscillation signal is higher than an output voltage of the output oscillation signal by at least a first threshold value; and
   (2) the output voltage is higher than the input voltage by at least a second threshold value,
   wherein the first switch circuit has a first on-state resistance smaller than a resistance of the feedback resistor; and
   wherein the first switch circuit comprises:
      a first transistor comprising a first terminal, a second terminal and a control terminal, wherein the first terminal of the first transistor is coupled with the input terminal, and the second terminal of the first transistor is coupled with the output terminal; and
      a first compensation resistor, wherein the first transistor and the first compensation resistor are coupled in series between the input terminal and the output terminal.

2. The oscillation circuit of claim 1, wherein the control terminal of the first transistor is coupled with the input terminal.

3. The oscillation circuit of claim 2, wherein the first compensation resistor is coupled between the first terminal of the first transistor and the input terminal.

4. The oscillation circuit of claim 3, wherein the first threshold value is a threshold voltage of the first transistor.

5. The oscillation circuit of claim 1, wherein the first switch circuit further comprises:
   a second transistor, comprising a first terminal, a second terminal and a control terminal, wherein the first terminal and the control terminal of the second transistor are coupled with the input terminal and the output terminal, respectively,
   wherein the control terminal of the first transistor is coupled with the input terminal,
   wherein the first compensation resistor is coupled between the first terminal of the first transistor and the second terminal of the second transistor.

6. The oscillation circuit of claim 5, wherein the first transistor and the second transistor are transistors of different types.

7. The oscillation circuit of claim 1, furthering comprising a second switch circuit coupled in parallel with the feedback resistor, and configured to conduct the input terminal and the output terminal to each other in another one of the plurality of situations, wherein the second switch circuit has a second on-state resistance smaller than the resistance of the feedback resistor.

8. The oscillation circuit of claim 7, wherein the second switch circuit comprises a third transistor comprising a first terminal, a second terminal and a control terminal, wherein the first terminal of the third transistor is coupled with the input terminal, and the second terminal and the control terminal of the third transistor are coupled with the output terminal.

9. The oscillation circuit of claim 7, wherein the second switch circuit comprises:
   a third transistor, comprising a control terminal coupled with the output terminal; and
   a second compensation resistor, wherein the third transistor and the second compensation resistor are coupled in series between the input terminal and the output terminal.

10. The oscillation circuit of claim 7, wherein the second switch circuit comprises:
    a third transistor, comprising a first terminal, a second terminal and a control terminal, wherein the first terminal and the control terminal of the third transistor are coupled with the input terminal and the output terminal, respectively; and
    a fourth transistor comprising a first terminal, a second terminal and a control terminal, wherein the first terminal, the second terminal and the control terminal of the fourth transistor are coupled with the second terminal of the third transistor, the output terminal and the input terminal, respectively.

11. The oscillation circuit of claim 7, wherein the second switch circuit comprises:
    a third transistor, comprising a first terminal, a second terminal and a control terminal, wherein the first terminal and the control terminal of the third transistor are coupled with the input terminal and the output terminal, respectively;
    a fourth transistor comprising a first terminal, a second terminal and a control terminal, wherein the second terminal and the control terminal of the fourth transistor are coupled with the output terminal and the input terminal, respectively; and a second compensation resistor, coupled between the second terminal of the third transistor and the first terminal of the fourth transistor.

12. The oscillation circuit of claim 1, wherein the control terminal of the first transistor is coupled with the output terminal.

13. The oscillation circuit of claim 12, wherein the first compensation resistor is coupled between the second terminal of the first transistor and the output terminal.

14. The oscillation circuit of claim 1, wherein the resistance of the feedback resistor is 10-500 times the first on-state resistance of the first switch circuit.

15. A method of automatic duty cycle calibration, comprising:
   receiving an oscillation signal by an input terminal of an amplifier;
   inverting and amplifying the oscillation signal by the amplifier to provide an output oscillation signal at an output terminal of the amplifier;
   conducting a first switch circuit coupled between the input terminal and the output terminal in one of a plurality of situations:
   (1) an input voltage of the oscillation signal is higher than an output voltage of the output oscillation signal by at least a first threshold value; and
   (2) the output voltage is higher than the input voltage by at least a second threshold value,
   wherein a feedback resistor is coupled between the input terminal and the output terminal, and the first switch circuit has a first on-state resistance smaller than a resistance of the feedback resistor; and
   wherein the first switch circuit comprises:
      a first transistor comprising a first terminal, a second terminal and a control terminal, wherein the first terminal of the first transistor is coupled with the input terminal, and the second terminal of the first transistor is coupled with the output terminal; and
      a first compensation resistor, wherein the first transistor and the first compensation resistor are coupled in series between the input terminal and the output terminal.

16. The method of claim 15, wherein if the first switch circuit is conducted when the input voltage is higher than the output voltage by at least the first threshold value, the first on-state resistance of the first switch circuit is negatively correlated with the input voltage.

17. The method of claim 15, wherein if the first switch circuit is conducted when the output voltage is higher than the input voltage by at least the second threshold value, the first on-state resistance of the first switch circuit is positively correlated with the input voltage.

18. The method of claim 15, further comprising:
   conducting a second switch circuit coupled between the input terminal and the output terminal in another one of the plurality of situations,
   wherein the second switch circuit has a second on-state resistance smaller than the resistance of the feedback resistor.

19. The method of claim 15, wherein the resistance of the feedback resistor is 10-500 times the first on-state resistance of the first switch circuit.

20. An oscillation circuit, comprising:
   an amplifier, comprising an input terminal and an output terminal, configured to invert and to amplify an oscillation signal received from the input terminal to provide an output oscillation signal at the output terminal;
   a feedback resistor, coupled between the input terminal and the output terminal; and
   a first switch circuit, coupled with the feedback resistor in parallel, configured to conduct the input terminal and the output terminal to each other in one of a plurality of situations:
   (1) an input voltage of the oscillation signal is higher than an output voltage of the output oscillation signal by at least a first threshold value; and
   (2) the output voltage is higher than the input voltage by at least a second threshold value,
   wherein the first switch circuit has a first on-state resistance smaller than a resistance of the feedback resistor;
   wherein the first switch circuit comprises:
      a first transistor, comprising a first terminal, a second terminal and a control terminal, wherein the second terminal and the control terminal of the first transistor are coupled with the output terminal and the input terminal, respectively; and
   a second transistor, comprising a first terminal, a second terminal and a control terminal, wherein the first terminal, the second terminal and the control terminal of the second transistor are coupled with the input terminal, the first terminal of the first transistor and the output terminal, respectively,
   wherein the first transistor and the second transistor are coupled in series between the input terminal and the output terminal.

* * * * *